United States Patent
Huh et al.

(10) Patent No.: US 9,806,291 B2
(45) Date of Patent: Oct. 31, 2017

(54) COVER WINDOW, MANUFACTURING METHOD THEREOF AND FLEXIBLE DISPLAY APPARATUS COMPRISING THE SAME

(71) Applicant: Samsung Display Co., Ltd., Yongin-si, Gyeonggi-do (KR)

(72) Inventors: Myungsoo Huh, Yongin-si (KR); Sungchul Kim, Yongin-si (KR); Choelmin Jang, Yongin-si (KR); Cheollae Roh, Yongin-si (KR); Jaihyuk Choi, Yongin-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/369,663

(22) Filed: Dec. 5, 2016

(65) Prior Publication Data
US 2017/0170428 A1  Jun. 15, 2017

(30) Foreign Application Priority Data

Dec. 15, 2015  (KR) ........................ 10-2015-0179200

(51) Int. Cl.
*H01L 51/52* (2006.01)
*H01L 51/00* (2006.01)
*H01L 51/56* (2006.01)
*H01L 27/32* (2006.01)

(52) U.S. Cl.
CPC ...... *H01L 51/5253* (2013.01); *H01L 27/3246* (2013.01); *H01L 27/3262* (2013.01); *H01L 51/0097* (2013.01); *H01L 51/56* (2013.01)

(58) Field of Classification Search
CPC . H01L 51/5253; H01L 51/0097; H01L 51/56; H01L 27/3246; H01L 27/3262
See application file for complete search history.

(56) References Cited

U.S. PATENT DOCUMENTS

| | | | |
|---|---|---|---|
| 6,228,796 B1 * | 5/2001 | Arakawa | B01D 53/86 428/325 |
| 9,005,739 B2 * | 4/2015 | Van Den Bossche | B32B 27/08 428/195.1 |
| 2004/0152239 A1 | 8/2004 | Bao et al. | |
| 2006/0243379 A1 | 11/2006 | Livesay et al. | |
| 2011/0020615 A1 | 1/2011 | Van Den Bossche et al. | |
| 2012/0034449 A1 | 2/2012 | Imamura et al. | |

FOREIGN PATENT DOCUMENTS

JP    11-135984 A    5/1999
KR    10-2009-0093482 A    9/2009

* cited by examiner

*Primary Examiner* — Dung Le
(74) *Attorney, Agent, or Firm* — Knobbe, Martens, Olson & Bear LLP

(57) ABSTRACT

Provided is a cover window includes a first layer including a polymer material, a second layer above a first surface of the first layer and including an oxide of a first metal, and an intermediate region between the first layer and the second layer, wherein the intermediate region includes the oxide of the first metal where the first metal binds to a dangling bond of oxygen of the polymer material, and the oxide of the first metal included in the second layer has a different composition ratio than the oxide of the first metal included in the intermediate region.

20 Claims, 3 Drawing Sheets

COVER WINDOW, MANUFACTURING METHOD THEREOF AND FLEXIBLE DISPLAY APPARATUS COMPRISING THE SAME

CROSS-REFERENCE TO RELATED APPLICATION

Any and all priority claims identified in the Application Data Sheet, or any correction thereto, are hereby incorporated by reference under 37 CFR 1.57. For example, this application claims the benefit of Korean Patent Application No. 10-2015-0179200, filed on Dec. 15, 2015, in the Korean Intellectual Property Office, the disclosure of which is incorporated herein in its entirety by reference.

BACKGROUND

Field

The present disclosure relates to a cover window, a method of manufacturing the cover window, and a flexible display apparatus including the cover window.

Description of the Related Technology

As interest in flexible display apparatuses has grown recently, research into the flexible display apparatuses has been actively conducted, and a flexible substrate including materials such as resin is used instead of a glass substrate to form such flexible display apparatuses.

A display apparatus may include a window over the entire surface of a display panel to protect the display panel. However, in the case of a flexible display apparatus, as the display apparatus is bent, the window also has to be bent, and accordingly, a flexible window has to be used. However, such a flexible window lacks durability. For example, a flexible window may be damaged due to factors such as external shock, or a surface of the flexible window may be scratched. Also, when a hard coating layer is formed on the surface of the flexible window to address this problem, flexible characteristics of the window degrade, and the hard coating layer may be separated from an interface between the window and the hard coating layer or may be subject to damage, such as cracks.

SUMMARY

One or more embodiments include a cover window that maintains flexibility and at the same time, has excellent durability, a method of manufacturing the cover window, and a flexible display apparatus that includes the cover window. However, such a technical problem is an example, and thus, the present embodiments are not limited thereto.

Additional aspects will be set forth in part in the description which follows and, in part, will be apparent from the description, or may be learned by practice of the presented embodiments.

According to one or more embodiments, a cover window may include a first layer including a polymer material, a second layer above a first surface of the first layer and including an oxide of a first metal, and an intermediate region between the first layer and the second layer, wherein the intermediate region includes the oxide of the first metal where the first metal binds to a dangling bond of oxygen included in the polymer material, and the oxide of the first metal included in the second layer has a different composition ratio than the oxide of the first metal included in the intermediate region.

In some embodiments, the oxide of the first metal included in the second layer may have a greater oxygen composition ratio than the oxide of the first metal included in the intermediate region.

In some embodiments, the intermediate region may include a first point and a second point that is closer to the first layer than the first point is, and an oxygen composition ratio of the oxide of the first metal included in the intermediate region may decrease in a direction from the first point to the second point.

In some embodiments, an amount of the first metal may decrease in a direction from the second point to the first point.

In some embodiments, the first metal may include at least one selected from titanium, aluminum, molybdenum, tantalum, copper, indium, tin, and tungsten.

In some embodiments, the cover window may further include an organic layer on the second layer, and a third layer on the organic layer, the third layer including an oxide of a second metal.

In some embodiments, a refractive index of the second layer may be greater than a refractive index of the intermediate region.

Some embodiments provide a method of manufacturing a cover window includes forming a first layer by using a polymer material, forming a seed layer on a first surface of the first layer by using a first metal, forming a second layer by depositing an oxide of the first metal on the seed layer, and heating the seed layer by irradiating an electronic beam on the second layer, wherein the heated seed layer forms an intermediate region by a reaction between the first layer and the second layer, and the intermediate region includes the oxide of the first metal where the first metal binds to a dangling bond of oxygen included in the polymer material, and a composition ratio of the oxide of the first metal included in the intermediate region is different from a composition ratio of the oxide of the first metal included in the second layer.

In some embodiments, an oxygen composition ratio of the oxide of the first metal included in the intermediate region may be less than an oxygen composition ratio of the oxide of the first metal included in the second layer.

In some embodiments, the intermediate region may include a first point and a second point that is closer to the first layer than the first point is, and an oxygen composition ratio of the oxide of the first metal included in the intermediate region may decrease in a direction from the first point to the second point.

In some embodiments, an amount of the first metal may decrease in a direction from the second point to the first point.

In some embodiments, the seed layer may have a thickness of about 3 Å to about 250 Å.

In some embodiments, the second layer may have a thickness of about 10 nm to about 100 nm.

Some embodiments provide a flexible display apparatus includes a display panel including display devices, and one of the above-described cover windows on the display panel, wherein a second surface of the first layer that is opposite to the first surface faces the display panel.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
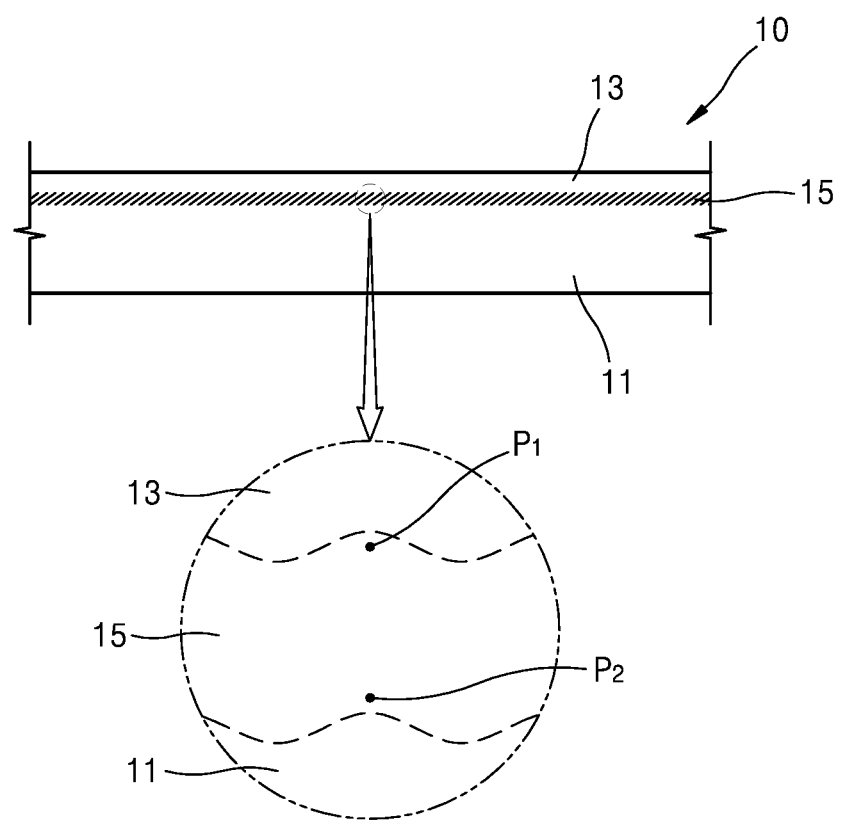
FIG. 1 is a schematic cross-sectional view of an example of a cover window according to an embodiment.

Hereinafter, examples of embodiments of the disclosure will be described in detail with reference to the accompanying drawings. However, this is not intended to limit the embodiments to particular modes of practice, and it is to be appreciated that all changes, equivalents, and substitutes that do not depart from the spirit and technical scope of the present disclosure are encompassed in the embodiments. In the description of the embodiments, certain detailed explanations of the related art are omitted when it is deemed that they may unnecessarily obscure the essence of the embodiments.

The terms used herein are merely used to describe exemplary embodiments and are not intended to limit the embodiments. An expression used in the singular encompasses the expression of the plural, unless it has a clearly different meaning in the context. Also, sizes of components in each drawing are exaggerated, omitted, or schematically illustrated for convenience and clarity of description, and a size of each of the components does not completely reflect an actual size of the component.

Reference will now be made in detail to embodiments, examples of which are illustrated in the accompanying drawings. Like reference numerals in the drawings denote like elements, and thus a repeated description thereof will be omitted. As used herein, the term "and/or" includes any and all combinations of one or more of the associated listed items. Expressions such as "at least one of" when preceding a list of elements, modify the entire list of elements and do not modify the individual elements of the list.

Sizes of components in the drawings may be exaggerated or reduced for convenience of description. In other words, since sizes and thicknesses of components in the drawings are arbitrarily illustrated for convenience of description, embodiments are not limited thereto.

FIG. 1 is a schematic cross-sectional view of an example of a cover window 10 according to an embodiment.

Referring to FIG. 1, the cover window 10 includes a first layer 11, a second layer 13 above the first layer 11, and an intermediate region 15 between the first layer 11 and the second layer 13.

In some embodiments, the first layer 11 and the intermediate region 15 connect to each other due to a chemical reaction. Accordingly, there is no physical boundary between the first layer 11 and the intermediate region 15, and thus, hereinafter, a region that includes only a polymer material used to form the first layer 11 will be referred to as the first layer 11.

Likewise, the second layer 13 and the intermediate region 15 also connect to each other due to a chemical reaction, and thus, there is no physical interface between the second layer 13 and the intermediate region 15. Accordingly, hereinafter, for convenience of description, a region that includes only a material used to form the second layer 13 will be referred to as the second layer 13, and a region between the first layer 11 and the second layer 13 will be referred to as the intermediate region 15.

In some embodiments, the first layer 11 forms the entire area of the cover window 10 and may be light-transmissive and flexible.

In some embodiments, the first layer 11 may include a polymer material, such as polyethersulfone (PES), polyacrylate, polyetherimide (PEI), polyethylene naphthalate (PEN), polyethylene terephthalate (PET), polyphenylene sulfide (PPS), polyarylate (PAR), polyimide, polycarbonate (PC), cellulose triacetate (TAC), or cellulose acetate propionate (CAP). In some embodiments, the first layer 11 may have a thickness of about 500 µm or less.

In some embodiments, the second layer 13 may include a first metal oxide and have excellent durability and light-transmittance. In some embodiments, the second layer 13 may be disposed above a first surface of the first layer 11 to prevent the first surface of the first layer 11 from being exposed to the outside and prevent damage to the first layer 11 due to factors such as shock. In some embodiments, the second layer 13 may have a thickness of 100 µm or less.

In some embodiments, the first metal oxide used to form the second layer 13 may be an oxide of a first metal including at least one of titanium, aluminum, molybdenum, tantalum, copper, indium, tin, and tungsten. In some embodiments, the first metal oxide used to form the second layer 13 may be $TiO_2$. In some embodiments, the second layer 13 may include a nitride of the first metal instead of the first metal oxide.

In some embodiments, the intermediate region 15 may be continuously formed with the first layer 11 and the second layer 13. In some embodiments, the intermediate layer 15, which is a region where composition and/or an element of a material used to form the first layer 11 and the second layer 13 changes, may make the first layer 11 and the second layer 13 integrated with each other without having a physical boundary between the first layer 11 and the second layer 13.

In some embodiments, the intermediate region 15 may include a first metal oxide (hereinafter, referred to as a first metal oxide (2)) that has the same chemical elements as the first metal oxide (hereinafter, referred to as a first metal oxide (1)) used to form the second layer 13. In some embodiments, the intermediate region 15 may include an intermediate layer metal oxide that has the same chemical elements as the first metal oxide used to form the second layer 13. Accordingly, the intermediate region 15 and the second layer 13 may have a continuous phase.

However, the first metal oxide (1) and the first metal oxide (2) may have different composition ratios of oxygen from each other. For example, when the first metal oxide (1) is $TiO_2$, the first metal oxide (2) may be $TiO_x$ (x<2). As will be described later, a seed layer (16 of FIG. 3) that includes Ti binds to oxygen spread from the second layer 13, thereby forming the intermediate region 15, and thus, the first metal oxide (2) included in the intermediate region 15 may have a smaller composition ratio of oxygen than the first metal oxide (1).

Since the first metal oxide (2) has a smaller composition ratio of oxygen than the first metal oxide (1), a refractive index of the intermediate region 15 is less than a refractive index of the second layer 13. Accordingly, when the cover window 10 is mounted in a flexible display apparatus, the light-output efficiency of light generated from the flexible display apparatus may improve.

In some embodiments, the intermediate region 15 may include the first metal where the first metal binds to a dangling bond of oxygen included in the polymer material used to form the first layer 11.

For example, when the first layer 11 includes PET that has a repeated structure of —$OCH_2CH_2OCOC_6H_4CO$—, and as will be described later, the seed layer (16 of FIG. 3) is formed on the first layer 11 and then heated, in the first layer 11 adjacent to the seed layer (16 of FIG. 3), the above structure of PET may be partially cleaved to provide oxygen having a dangling bond. In this regard, the first metal used to form the seed layer (16 of FIG. 3) may bind to the dangling bond of the oxygen. Accordingly, the first layer 11 and the intermediate region 15 may be continuously formed without a physical boundary.

In some embodiments, the intermediate region 15 may include a first point P1, and a second point P2 that is closer to the first layer 11 than the first point P1 is, and composition ratio or content of a material used to form the intermediate region 15 may change between the first point P1 and the second point P2. In detail, in a direction from the first point P1 to the second point P2, an oxygen composition ratio of the first metal oxide (2) may decrease, whereas an amount of the first metal may increase.

Likewise, as the intermediate region 15 is formed between the first layer 11 and the second layer 13, the composition ratio or content of a material used to form the intermediate region 15 gradually changes in the intermediate region 15, and the intermediate region 15 is continuously formed with the first layer 11 and the second layer 13, the first layer 11 and the second layer 13 including different materials from each other may be integrated with each other. Accordingly, the second layer 13 may be kept attached to the first layer 11 with an excellent adhesive force, and thus, even when the cover window 10 is repeatedly bent, separation of the second layer 13 serving as a protective layer is prevented.

Figure 2:
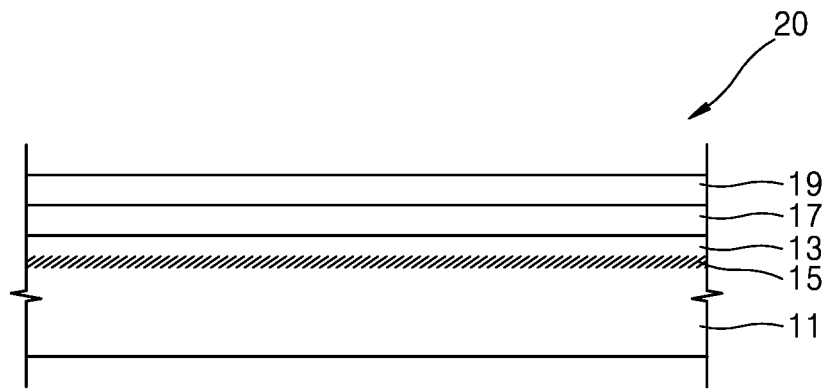
FIG. 2 is a schematic cross-sectional view of a modified example of the cover window of FIG. 1.

FIG. 2 is a schematic cross-sectional view of a modified example of the cover window 10.

Referring to FIG. 2, a cover window 20 includes the first layer 11, the second layer 13 above the first layer 11, and the intermediate region 15 between the first layer 11 and the second layer 13 and may further include an organic layer 17 and a third layer 19 on the second layer 13.

The first layer 11, the intermediate region 15, and the second layer 13 are the same as illustrated in FIG. 1 and described above with reference to FIG. 1, and thus, a repeated description thereof will be omitted.

In some embodiments, the third layer 19 may include an oxide of a second metal. In some embodiments, the second metal may include at least one of titanium, aluminum, molybdenum, tantalum, copper, indium, tin, and tungsten. In some embodiments, the second metal oxide used to form the third layer 19 may be $TiO_2$. In some embodiments, the oxide of the second metal may be the same as the first metal oxide (1) used to form the second layer 13. However, it is not limited thereto.

In some embodiments, the organic layer 17 may be disposed between the second layer 13 and the third layer 19 to alleviate stress generated in the second layer 13 and the third layer 19. Accordingly, flexibility of the cover window 20 may improve, and when the cover window 20 is repeatedly bent, damage, such as cracks, to the second layer 13 and the third layer 19 may be prevented.

In some embodiments, the organic layer 17 may include polymethyl methacrylate (PMMA), PC, polystyrene (PS), acrylic-based resin, epoxy-based resin, polyimide, polyethylene, or the like.

Figure 3:
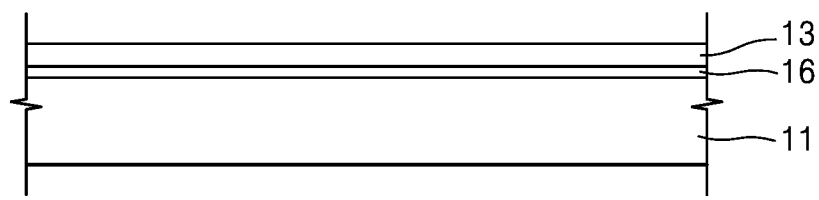
FIGS. 3 and 4 are schematic cross-sectional views of a method of manufacturing the cover window of FIG. 1.
Figure 4:
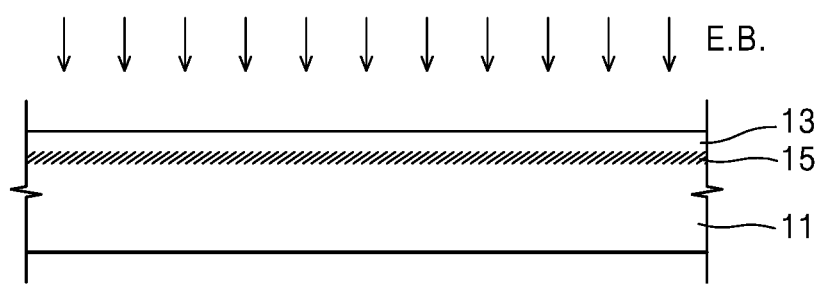

FIGS. 3 and 4 are schematic cross-sectional views of a method of manufacturing the cover window 10.

Referring to FIGS. 3 and 4, a method of manufacturing a cover window, according to an embodiment, may include forming the first layer 11 by using a polymer material, forming the seed layer 16 on the first surface of the first layer 11 by using the first metal, forming the second layer 13 by depositing the oxide of the first metal on the seed layer 16, and heating the seed layer 16 by irradiating an electronic beam (E.B.) on the second layer 13.

Surface treatment may be performed on the first layer 11 to improve adhesion to a metal layer. In some embodiments, the surface treatment may be performed using plasma treatment, UV—$O_3$ treatment, or the like.

In some embodiments, the first metal may be a material that has excellent oxidation reaction. In some embodiments, the first metal may be titanium, aluminum, molybdenum, tantalum, copper, indium, tin, tungsten, or the like. In some embodiments, the seed layer 16 may be formed using a sputtering method, a vapor deposition method, or the like. In some embodiments, the seed layer 16 may be formed using an electrolysis plating method, or the like.

In some embodiments, the seed layer 16 may have a thickness of about 3 Å to about 250 Å. The seed layer 16, as will be described later, is used to form the intermediate region 15 continuously with the first layer 11 and the second layer 13. When a thickness of the seed layer 16 is less than 3 Å, it is hard to form the intermediate region 15, and thus, it may be hard to provide a sufficient binding force for bonding the first layer 11 and the second layer 13.

However, when the thickness of the seed layer 16 is greater than 250 Å, a metal layer may remain in the intermediate region 15 even after the intermediate region 15 is formed. When the metal layer remains as such, a discontinuous phase may be present in the intermediate region 15. Accordingly, when the cover window is repeatedly bent, blistering may occur at an interface with the metal layer, and the metal layer may have cracks or the like.

In some embodiments, the second layer 13 may be formed by depositing the oxide of the first metal. In some embodiments, the second layer 13 may be formed using the sputtering method, the vapor deposition method, an ion plating method, an atomic layer deposition method, or the like.

In some embodiments, the second layer 13 may have a thickness of about 10 nm to about 100 nm. When a thickness of the second layer 13 is less than 10 nm, the second layer 13 may not have sufficient durability, and thus, it is hard for the second layer 13 to serve as a protective layer that protects the first layer 11. However, when the thickness of the second layer 13 is greater than 100 nm, flexible characteristics of the cover window may decrease.

After the second layer 13 is formed, the electronic beam (E.B.) is irradiated on the second layer 13. The electronic beam (E.B.) goes through the second layer 13 and heats the seed layer 16. In detail, electrons in the first metal are excited by the electronic beam E.B., and thus, lattice vibration occurs, thereby heating the seed layer 16. Due to the heating of the seed layer 16, the lattice vibration is accelerated, and as a result, interfaces between the seed layer 16 and the first layer 11 and between the seed layer 16 and the second layer 13 are annealed. Intensity of the electronic beam (E.B.) to be irradiated may be determined by taking into account factors such as a thickness of the first layer 11 and a material of the seed layer 16.

Due to the annealing, a chemical reaction occurs at the interface between the seed layer 16 and the first layer 11 and at the interface between the seed layer 16 and the second layer 13, and thus, the interfaces disappear, and the seed layer 16 ends up forming the intermediate region 15 continuously with the first layer 11 and the second layer 13.

For example, when the seed layer 16 includes Ti, and the second layer 13 includes $TiO_2$, oxygen of the $TiO_2$ in the second layer 13, due to the irradiating of the electronic beam (E.B.), binds to Ti of the seed layer 16. Accordingly, the intermediate region 15 comes to include the first metal oxide (2) and may have a continuous phase with the second layer 13. However, the first metal oxide (2) has a smaller composition ratio of oxygen than the first metal oxide (1), and thus, the refractive index of the intermediate region 15 may be less than the refractive index of the second layer 13.

Also, the polymer material used to form the first layer 11 may have a polymer chain partially cleaved to provide oxygen having a dangling bond, and Ti of the seed layer 16 may bind to the dangling bond of the oxygen. Accordingly, the first layer 11 and the intermediate region 15 may be continuously formed without a physical boundary.

As illustrated in FIG. 2, the organic layer 17 and the third layer 19 may be further formed on the second layer 13.

In some embodiments, the organic layer 17 may be formed by vaporizing an organic material with an evaporator, such as a flash evaporator, and spraying a vaporized organic material, and the third layer 19 may be formed using the same method as the second layer 13.

Figure 5:
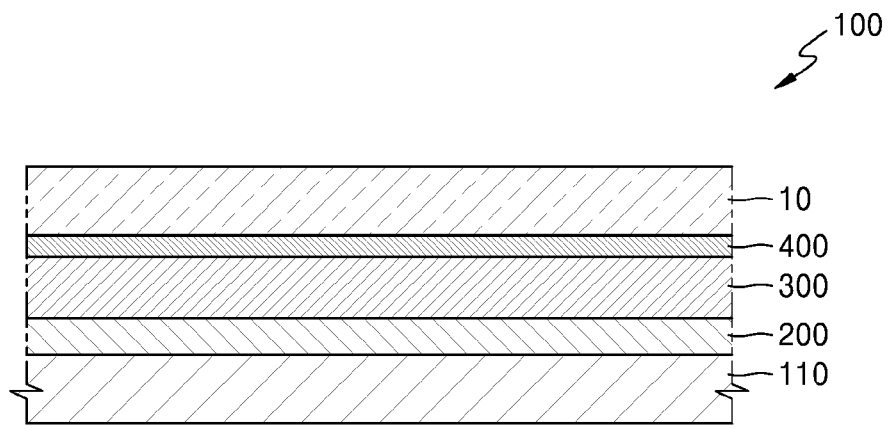
FIG. 5 is a schematic cross-sectional view of a flexible display apparatus according to another embodiment.
Figure 6:
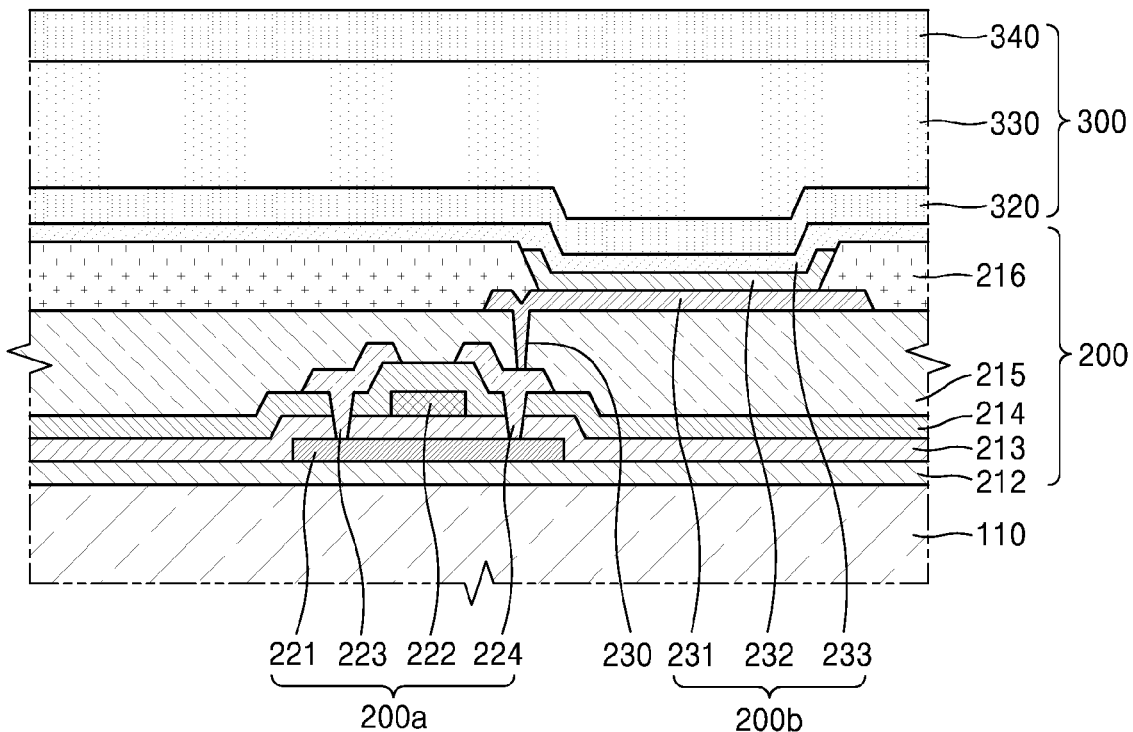
FIG. 6 is a schematic cross-sectional view of an example of a display and a thin film encapsulation layer of the flexible display apparatus of FIG. 5.

FIG. 5 is a schematic cross-sectional view of a flexible display apparatus 100 according to another embodiment. FIG. 6 is a schematic cross-sectional view of an example of a display 200 and a thin film encapsulation layer 300 of the flexible display apparatus 100.

Referring to FIGS. 5 and 6, the flexible display apparatus 100 may include a display panel that includes a substrate 110, the display 200 on the substrate 110, and the thin film encapsulation layer 300 sealing the display 200, and a function layer 400 and the cover window 10 on the display panel.

In some embodiments, the substrate 110 may include a plastic material having flexibility. In some embodiments, the substrate 110 may include PES, polyacrylate, PEI, PEN, PET, PPS, PAR, polyimide, PC, TAC, CAP, or the like.

When the flexible display apparatus 100 is of a bottom emission type that embodies an image toward the substrate 110, the substrate 110 has to include a transparent material. However, when the flexible display apparatus 100 is a top emission type that embodies an image toward the thin film encapsulation layer 300, the substrate 110 does not need to include a transparent material, and the substrate 110 may include opaque metal having flexibility. When the substrate 110 includes metal, the substrate 110 may include one or more materials selected from a group including iron, chromium, manganese, nickel, titanium, molybdenum, stainless steel (SUS), Invar alloy, Inconel alloy, and Kovar alloy. Furthermore, the substrate 100 may include metal foil.

In some embodiments, the display 200 may be on the substrate 110. In some embodiments, the display 200 may include a thin film transistor 200a and an organic light-emitting device 200b. However, the present disclosure is not limited thereto, and the display 200 may include various types of display devices. In the following description, the display 200 will be described with reference to FIG. 6.

A buffer layer 212 may be formed on the substrate 110. The buffer layer 212 prevents intrusion of impurities into the substrate 110 and provides a flat surface on the substrate 110. In some embodiments, the buffer layer 212 may include an inorganic material, such as silicon oxide, silicon nitride, silicon oxynitride, aluminum oxide, aluminum nitride, titanium oxide, or titanium nitride, or an organic material, such as polyimide, polyester, or acrylic, and may include stacks of the above-described materials.

In some embodiments, the thin film transistor 200a may include an active layer 221, a gate electrode 222, a source electrode 223, and a drain electrode 224.

In some embodiments, the active layer 221 may include an inorganic semiconductor, such as silicon, or an organic semiconductor. Furthermore, the active layer 221 has a source region, a drain region, and a channel region between the source region and the drain region. For example, when the active layer 221 is formed using amorphous silicon, an amorphous silicon layer is formed over the entire surface of the substrate 110 and then crystallized to form a polycrystalline silicon layer. The polycrystalline silicon layer is patterned, and then, a source region and a drain region at the edge of the active layer 221 are doped with impurities, thereby forming the active layer 221 including the source region, the drain region, and the channel region between the source region and the drain region.

A gate insulation layer 213 is formed over the active layer 221. The gate insulation layer 213 is for insulating the active layer 221 and the gate electrode 222 from each other and may include an inorganic material, such as SiNx or $SiO_2$.

The gate electrode 222 is formed in a certain area on an upper surface of the gate insulation layer 213. The gate electrode 222 is connected to a gate line (not shown) for applying an on/off signal of the thin film transistor 200a. In some embodiments, the gate electrode 222 may include Au, Ag, Cu, Ni, Pt, Pd, Al, or Mo, or an alloy, such as Al:Nd alloy or Mo:W alloy. However, the present disclosure is not limited thereto, and the gate electrode 222 may be formed of various materials by taking into account design conditions.

An interlayer insulation layer 214 that is formed over the gate electrode 222 is for insulation between the gate electrode 222 and the source electrode 223 and between the gate electrode 222 and the drain electrode 224 and may include an inorganic material, such as SiNx or $SiO_2$.

The source electrode 223 and the drain electrode 224 are formed over the interlayer insulation layer 214. In detail, the interlayer insulation layer 214 and the gate insulation layer 213 expose the source region and the drain region of the active layer 221, and the source electrode 223 and the drain electrode 224 respectively contact the exposed source and drain regions of the active layer 221.

In some embodiments, the source electrode 223 and the drain electrode 224 may include one or more materials of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer or a multilayer.

Although FIG. 6 illustrates the thin film transistor 200a of a top gate type sequentially including the active layer 221, the gate electrode 222, and the source electrode 223 and the drain electrode 224, the present disclosure is not limited thereto, and the gate electrode 222 may be under the active layer 221.

The thin film transistor 200a is electrically connected to the organic light-emitting device 200b and applies a signal for driving the organic light-emitting device 200b to the organic light-emitting device 200b. The thin film transistor 200a may be covered and protected by a planarization layer 215.

In some embodiments, the planarization layer 215 may include an inorganic insulation film and/or organic insulation film. The inorganic insulation film may include $SiO_2$, SiNx, SiON, Al$_2$O$_3$, TiO$_2$, Ta$_2$O$_5$, HfO$_2$, ZrO$_2$, BST, or PZT, whereas the organic insulation film may include a general common polymer (PMMA, PS), a polymer derivative having a phenol-based group, an acrylic-based polymer, an imide-based polymer, an aryl ether-based polymer, an amide-based polymer, a fluorine-based polymer, a p-xylene-based polymer, a vinyl alcohol-based polymer, and a blend thereof. Furthermore, the planarization layer 215 may include a composite laminate of the inorganic insulation film and the organic insulation film.

In some embodiments, the organic light-emitting device 200b may be formed over the planarization layer 215. The organic light-emitting device 200b may include a pixel electrode 231, an intermediate layer 232, and an opposite electrode 233.

The pixel electrode 231 is formed on the planarization layer 215 and is electrically connected to the drain electrode 224 via a contact hole 230 in the planarization layer 215.

In some embodiments, the pixel electrode 231 may be a reflective electrode and may include a reflective film including Ag, Mg, Al, Pt, Pd, Au, Ni, Nd, Ir, Cr, and a compound thereof, and a transparent or semi-transparent electrode layer on the reflective film. The transparent or semi-transparent electrode layer may include at least one selected from a group including indium tin oxide (ITO), indium zinc oxide (IZO), zinc oxide (ZnO), indium oxide (In$_2$O$_3$), indium gallium oxide (IGO), and aluminum zinc oxide (AZO).

In some embodiments, the opposite electrode 233 facing the pixel electrode 231 may be a transparent or semi-transparent electrode and may include a metal thin film having a low work function and including Li, Ca, LiF/Ca, LiF/Al, Al, Ag, Mg, and a compound thereof. Furthermore, an auxiliary electrode layer or a bus electrode may be further formed on the metal thin film by using a material for forming a transparent electrode, such as ITO, IZO, ZnO, or In$_2$O$_3$.

Accordingly, the opposite electrode 233 may transmit therethrough light emitted from an organic emission layer (not shown) included in the intermediate layer 232. In some embodiments, the light emitted from the organic emission layer (not shown) may be emitted toward the opposite electrode 233 directly or by being reflected by the pixel electrode 231 that is a reflective electrode.

However, the display 200 according to the present embodiment is not limited to a top emission type and may be of a bottom emission type in which the light emitted from the organic emission layer (not shown) is emitted toward the substrate 110. In this case, the pixel electrode 231 may be a transparent or semi-transparent electrode, and the opposite electrode 233 may be a reflective electrode. Furthermore, the display 200 according to the present embodiment may be of a bidirectional emission type in which light is emitted in two directions toward the top surface and the bottom surface.

A pixel-defining layer 216 that includes an insulation material is formed on the pixel electrode 231. In some embodiments, the pixel-defining layer 216 may be formed using one or more organic insulation materials selected from a group including polyimide, polyamide, acrylic resin, benzocyclobutene, and phenol resin, by a method such as spin coating. The pixel-defining layer 216 exposes a certain area of the pixel electrode 231, and the intermediate layer 232 including the organic emission layer (not shown) is located in the exposed area of the pixel electrode 231.

In some embodiments, the organic emission layer (not shown) included in the intermediate layer 232 may be a low molecular organic material or polymer organic material, and the intermediate layer 232 may selectively further include functional layers, such as a hole transport layer (HTL), a hole injection layer (HIL), an electron transport layer (ETL), and an electron injection layer (EIL), in addition to the organic emission layer (not shown).

The thin film encapsulation layer 300 is disposed over the opposite electrode 233. The thin film encapsulation layer 300 covers the display 200 overall and prevents intrusion of external moisture and oxygen into the display 200. An area of the thin film encapsulation layer 300 may be larger than an area of the display 200 so that all edges of the thin film encapsulation layer 300 may contact the substrate 110, thereby further firmly preventing intrusion of external air.

In some embodiments, the thin film encapsulation layer 300 may include at least one organic layer 330 and at least one of inorganic layers 320 and 340. The at least one organic layer 330 and the at least one of inorganic layers 320 and 340 may be alternately stacked on each other. Although FIG. 6 illustrates that the thin film encapsulation layer 300 includes two inorganic layers 320 and 340 and one organic layer 330, the present disclosure is not limited thereto. In other words, the thin film encapsulation layer 300 may further include a plurality of additional inorganic layers and organic layers that are alternately arranged, and the number of stacks of the inorganic layer and the organic layer is not limited.

In some embodiments, the inorganic layers 320 and 340 may include one or more materials selected from a group including silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

In some embodiments, the organic layer 330 planarizes a step due to the pixel-defining layer 216 and may alleviate stress generated in the inorganic layers 320 and 340. Furthermore, when there are particles on the inorganic layer 320, the organic layer 330 may cover the inorganic layer 320 evenly.

In some embodiments, the inorganic layers 320 and 340 may be larger than the organic layer 330. In some embodiments, the inorganic layers 320 and 340 may contact each other outside the edge of the organic layer 330. Accordingly, the intrusion of external moisture or oxygen may be prevented more effectively.

Referring to FIG. 5 again, the function layer 400 may include at least one of a polarizer layer and a touchscreen layer. In some embodiments, the function layer 400 may be flexible.

The polarizer layer transmits therethrough only light oscillating in the same direction as a polarization axis and absorbs or reflects light oscillating in the other directions, from among light emitted from the display 200. In some embodiments, the polarizer layer may include a phase difference film that changes a linearly polarized light to a circularly polarized light or a circularly polarized light to a linearly polarized light by providing a phase difference of $\lambda/4$ to two polarized light components that are perpendicular to each other, and a polarizer film that arranges a direction of light passing through the phase difference film and divides the light into two polarization components perpendicular to each other to transmit therethrough only one of the two polarization components and absorb or scatter the other component.

In some embodiments, the touchscreen layer may include a touch sensor in which a first electrode and a second electrode are arranged to cross each other. In some embodiments, the touch sensor may be of a capacitance type in which a change in capacitance generated in a plurality of first electrodes and a plurality of second electrodes that are arranged to cross one another is sensed to determine contact condition of a corresponding part.

In some embodiments, the cover window 10 may be the same as illustrated in FIG. 1 and described above with reference to FIG. 1. Alternatively, the flexible display apparatus 100 may include the cover window (20 of FIG. 2) illustrated in FIG. 2 and described above with reference to FIG. 2.

Accordingly, the cover window 10 includes a first layer including a polymer material, a second layer including metal oxide, and an intermediate region between the first layer and the second layer, wherein the intermediate region is continuously formed with the first layer and the second layer, and as composition ratio or content of a material used to form the intermediate region gradually changes in the intermediate region, the first layer and the second layer may be integrated with each other. Accordingly, the second layer which is as a protective layer may be attached to the first layer with an excellent adhesive force, and thus, even when the flexible display apparatus 100 is repeatedly bent, separation of the second layer serving as a protective layer may be prevented.

Also, the second layer is disposed above a first surface of the first layer, and in the cover window 10, a second surface of the first layer that is opposite to the first surface faces the display panel. In this regard, since a refractive index of the intermediate region is less than a refractive index of the second layer, the light-output efficiency of the flexible display apparatus 100 may be improved.

According to one or more of the above embodiments, there are provided a cover window that maintains flexible characteristics and at the same time, has excellent durability and a flexible display apparatus that includes the cover window. However, the present embodiments are not limited by such an effect.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A cover window comprising:
a first layer comprising a polymer material;
a second layer above a first surface of the first layer and comprising an oxide of a first metal; and
an intermediate region between the first layer and the second layer,
wherein the intermediate region comprises the oxide of the first metal and the first metal bound to a dangling bond of oxygen of the polymer material, and
the oxide of the first metal comprised in the second layer has a different composition ratio than the oxide of the first metal comprised in the intermediate region.

2. The cover window of claim 1, wherein the oxide of the first metal comprised in the second layer has a greater oxygen composition ratio than the oxide of the first metal comprised in the intermediate region.

3. The cover window of claim 1, wherein the intermediate region comprises a first point and a second point that is closer to the first layer than the first point is, and an oxygen composition ratio of the oxide of the first metal comprised in the intermediate region decreases in a direction from the first point to the second point.

4. The cover window of claim 3, wherein an amount of the first metal bound to a dangling bond of oxygen of the polymer material decreases in a direction from the second point to the first point.

5. The cover window of claim 1, wherein the first metal comprises at least one selected from titanium, aluminum, molybdenum, tantalum, copper, indium, tin, and tungsten.

6. The cover window of claim 1, further comprising an organic layer on the second layer, and a third layer on the organic layer, the third layer comprising an oxide of a second metal.

7. The cover window of claim 1, wherein a refractive index of the second layer is greater than a refractive index of the intermediate region.

8. A method of manufacturing a cover window, the method comprising:
forming a first layer by using a polymer material;
forming a seed layer on a first surface of the first layer by using a first metal;
forming a second layer by depositing an oxide of the first metal on the seed layer; and
heating the seed layer by irradiating an electronic beam on the second layer,
wherein the heated seed layer forms an intermediate region by a reaction between the first layer and the second layer, and the intermediate region comprises the oxide of the first metal and the first metal bound to a dangling bond of oxygen of the polymer material, and
a composition ratio of the oxide of the first metal comprised in the intermediate region is different from a composition ratio of the oxide of the first metal comprised in the second layer.

9. The method of claim 8, wherein an oxygen composition ratio of the oxide of the first metal comprised in the intermediate region is less than an oxygen composition ratio of the oxide of the first metal comprised in the second layer.

10. The method of claim 8, wherein the intermediate region comprises a first point and a second point that is closer to the first layer than the first point is, and an oxygen composition ratio of the oxide of the first metal comprised in the intermediate region decreases in a direction from the first point to the second point.

11. The method of claim 10, wherein an amount of the first metal bound to a dangling bond of oxygen of the polymer material decreases in a direction from the second point to the first point.

12. The method of claim 8, wherein the seed layer has a thickness of about 3 Å to about 250 Å.

13. The method of claim 8, wherein the second layer has a thickness of about 10 nm to about 100 nm.

14. A flexible display apparatus comprising:
a display panel comprising display devices; and
the cover window of claim 1 on the display panel,
wherein a second surface of the first layer that is opposite to the first surface faces the display panel.

15. The flexible display apparatus of claim 14, wherein the oxide of the first metal comprised in the second layer has a greater oxygen composition ratio than the oxide of the first metal comprised in the intermediate region.

16. The flexible display apparatus of claim 14, wherein the intermediate region comprises a first point and a second point that is closer to the first layer than the first point is, and an oxygen composition ratio of the oxide of the first metal comprised in the intermediate region decreases in a direction from the first point to the second point.

17. The flexible display apparatus of claim 16, wherein an amount of the first metal bound to a dangling bond of oxygen of the polymer material decreases in a direction from the second point to the first point.

18. The flexible display apparatus of claim 14, wherein the first metal comprises at least one selected from titanium, aluminum, molybdenum, tantalum, copper, indium, tin, and tungsten.

19. The flexible display apparatus of claim 14, further comprising an organic layer on the second layer, and a third layer on the organic layer, the third layer comprising an oxide of a second metal.

20. The flexible display apparatus of claim 14, wherein a refractive index of the second layer is greater than a refractive index of the intermediate region.

\* \* \* \* \*